US011535932B2

(12) United States Patent
Monden

(10) Patent No.: US 11,535,932 B2
(45) Date of Patent: Dec. 27, 2022

(54) FILM FORMING METHOD AND FILM FORMING APPARATUS

(71) Applicant: TOKYO ELECTRON LIMITED, Tokyo (JP)

(72) Inventor: Taichi Monden, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 415 days.

(21) Appl. No.: 16/508,348

(22) Filed: Jul. 11, 2019

(65) Prior Publication Data

US 2020/0017963 A1 Jan. 16, 2020

(30) Foreign Application Priority Data

Jul. 13, 2018 (JP) .............................. JP2018-133608

(51) Int. Cl.
*C23C 16/44* (2006.01)
*C23C 16/52* (2006.01)
*H01L 21/02* (2006.01)

(52) U.S. Cl.
CPC ...... *C23C 16/4408* (2013.01); *C23C 16/4405* (2013.01); *C23C 16/52* (2013.01); *H01L 21/0262* (2013.01)

(58) Field of Classification Search
None
See application file for complete search history.

(56) References Cited

U.S. PATENT DOCUMENTS

| | | | | |
|---|---|---|---|---|
| 2004/0180553 | A1* | 9/2004 | Park ................... | C23C 16/45519 438/785 |
| 2014/0295083 | A1* | 10/2014 | Nasu ................... | C23C 16/4408 427/255.28 |
| 2015/0155201 | A1* | 6/2015 | Sato .................. | C23C 16/45519 438/680 |
| 2017/0298508 | A1* | 10/2017 | Yamakoshi ....... | C23C 16/45574 |

FOREIGN PATENT DOCUMENTS

| | | |
|---|---|---|
| CN | 104073780 A | 10/2014 |
| CN | 107686985 A | 2/2018 |
| JP | 2014-198872 A | 10/2014 |
| KR | 1020140118784 A | 10/2014 |
| KR | 1020180015579 A | 2/2018 |

* cited by examiner

*Primary Examiner* — Mandy C Louie
(74) *Attorney, Agent, or Firm* — Nath, Goldberg & Meyer; Jerald L. Meyer; Tanya E. Harkins

(57) ABSTRACT

A film forming method includes forming a film by sequentially performing operations for each of a plurality of kinds of reaction gases, the operations being of storing the reaction gas in a storage part to raise a pressure in the storage part to a first pressure and then discharging the reaction gas into the process vessel, while continuously supplying the counter gas, and purging by repeating multiple times operations of storing a purge gas in the storage part provided in the reaction gas supply passage to raise the pressure in the storage part to a second pressure higher than the first pressure, and discharging the purge gas into the process vessel. A flow rate of the counter gas supplied into the process vessel in the purging is smaller than a flow rate of the counter gas supplied into the process vessel in the forming the film.

6 Claims, 7 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2018-133608, filed on Jul. 13, 2018, the entire contents of which are incorporated herein by reference.

TECHNICAL FIELD

The present disclosure relates to a film forming method and a film forming apparatus.

BACKGROUND

A film forming apparatus which performs a film forming process by sequentially supplying a plurality of kinds of reaction gases that react with each other to a substrate in a process vessel is known (see, for example, Patent Document 1). In this apparatus, after the film forming process is performed, particles adhered to portions that make contact with the reaction gas are removed by supplying a purge gas raised to a pressure higher than the pressure of the reaction gas into the process vessel.

Patent Document 1: Japanese Patent Application Publication No. 2014-198872

SUMMARY

According to one embodiment of the present disclosure, there is provided a film forming method of forming a thin film by sequentially supplying a plurality of kinds of reaction gases that react with each other to a substrate in a process vessel, which is in a vacuum atmosphere, via a reaction gas supply passage continuously and laminating a reaction product thereon, while continuously supplying a counter gas from a counter gas supply passage provided separately from the reaction gas supply passage provided for each kind of the reaction gases, the method including: forming a film by sequentially performing operations for each of the plurality of kinds of reaction gases, the operations being of storing the reaction gas in a storage part provided in the reaction gas supply passage to raise a pressure in the storage part to a first pressure and then discharging the reaction gas from the storage part into the process vessel, while continuously supplying the counter gas; and purging by repeating multiple times operations of storing a purge gas in the storage part provided in the reaction gas supply passage to raise the pressure in the storage part to a second pressure higher than the first pressure, and discharging the purge gas from the storage part into the process vessel, wherein a flow rate of the counter gas supplied into the process vessel in the purging is smaller than a flow rate of the counter gas supplied into the process vessel in the forming the film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Film Forming Apparatus

A film forming apparatus according to one embodiment of the present disclosure will be described. The film forming apparatus is an apparatus which forms a thin film of titanium nitride (TiN), which is a reaction product, by an ALD method by alternately supplying a titanium chloride ($TiCl_4$) gas and an ammonia ($NH_3$) gas that react with each other onto a semiconductor wafer (hereinafter, referred to as a "wafer") as an example of a substrate.

Figure 1:
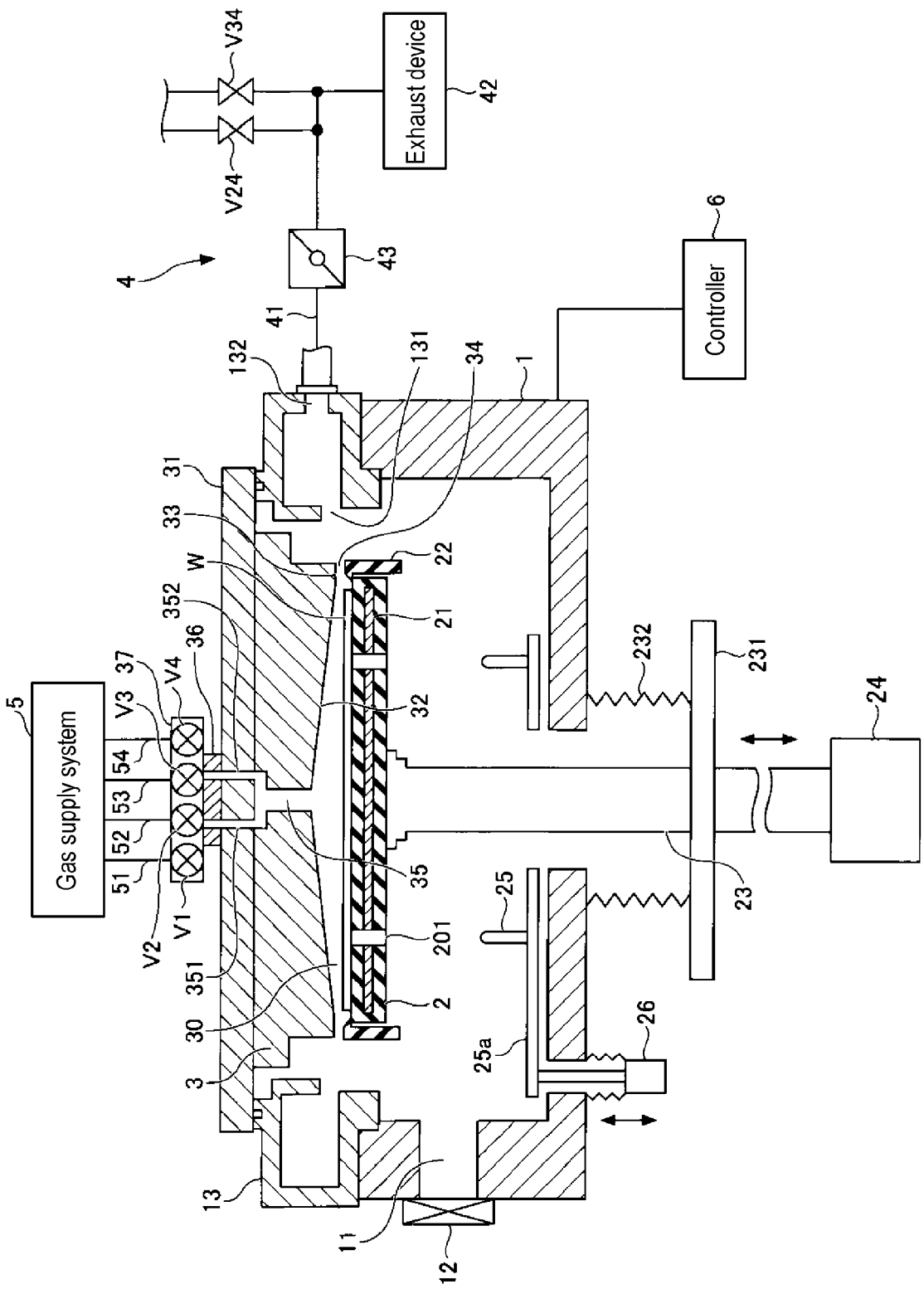
FIG. 1 is a schematic view illustrating a configuration example of a film forming apparatus.

FIG. 1 is a schematic view illustrating a configuration example of a film forming apparatus. As illustrated in FIG. 1, the film forming apparatus includes a process vessel 1, a mounting table 2, a ceiling plate member 3, an exhaust mechanism 4, a gas supply system 5, and a controller 6.

The process vessel 1 is made of metal such as aluminum and has a substantially cylindrical shape. A loading/unloading port 11 for loading or unloading a wafer W is formed on a sidewall of the process vessel 1. The loading/unloading port 11 is opened and closed by a gate valve 12. An annular exhaust duct 13 having a rectangular cross section is installed on the main body of the process vessel 1. A slit 131 is formed along the inner peripheral surface of the exhaust duct 13. In addition, an exhaust port 132 is formed on an outer wall of the exhaust duct 13. A lid 31 is installed on an upper surface of the exhaust duct 13 so as to close the upper opening of the process vessel 1. A seal ring (not shown) is airtightly sealed between the lid 31 and the exhaust duct 13.

The mounting table 2 horizontally supports the wafer W in the process vessel 1. The mounting table 2 has a disc shape of a size corresponding to the wafer W, and is supported by a support member 23. The mounting table 2 is made of a ceramic material such as aluminum nitride (AlN) or a metal such as aluminum or a nickel-based alloy, and has a heater 21 for heating the wafer W embedded therein. The heater 21 generates heat using power from a heater power source (not shown). Furthermore, it is configured so that the wafer W is controlled to a predetermined temperature by controlling an output of the heater 21 based on a temperature signal of a thermocouple (not shown) installed near a wafer mounting surface on the upper surface of the mounting table 2.

A cover member 22 made of a ceramic material such as alumina is installed in the mounting table 2 so as to cover an outer peripheral region of the wafer mounting surface and a side surface of the mounting table 2.

The support member 23 penetrates a hole portion formed on a bottom wall of the process vessel 1 from the center of the bottom of the mounting table 2 and extends downward of the process vessel 1, in which a lower end of the support member 23 is connected to an elevating mechanism 24. The elevating mechanism 24 is configured to move the mounting table 2 up and down between a transfer position which transfers the wafer W in and out of a transfer mechanism (not shown), and a processing position (a position illustrated in FIG. 1) which is above the transfer position and at which a film is formed on the wafer W. A flange 231 is installed under the process vessel 1 of the support member 23, and a bellows 232, which partitions an internal atmosphere of the process vessel 1 from the outside air and expands and contracts according to an elevating operation of the mounting table 2, is installed between the bottom surface of the process vessel 1 and the flange 231.

For example, three (only two are shown here) support pins 25, which protrude upward from an elevating plate 25a, are installed near the bottom surface of the process vessel 1. The support pins 25 are configured to be elevated or lowered through the elevating plate 25a by the elevating mechanism 26 installed below the process vessel 1, and to pass through holes 201 formed in the mounting table 2 at the transfer position so as to protrude from the upper surface of the mounting table 2. The wafer W is transferred between the transfer mechanism and the mounting table 2 by elevating or lowering the support pins 25.

The ceiling plate member 3 is made of, e.g., metal, and is installed on a lower surface of the lid 31 so as to face the mounting table 2. The ceiling plate member 3 supplies a reaction gas, a purge gas, or the like to the processing space 30. A recess 32 is formed on a lower surface of the ceiling plate member 3, and has an inclined surface formed to be gradually widened from the center of the recess 32 toward the outer periphery thereof. An annular flat leading end 33 is formed at an outer portion of the inclined surface.

In a state in which the mounting table 2 is raised to the processing position, the lower surface of the leading end 33 of the ceiling plate member 3 is arranged to face the upper surface of the cover member 22. A space surrounded by the recess 32 of the ceiling plate member 3 and the upper surface of the mounting table 2 becomes the processing space 30 where a film is formed on the wafer W. Furthermore, a height position of the processing position is set such that a gap 34 is formed between the lower surface of the leading end 33 of the ceiling plate member 3 and the upper surface of the cover member 22. The slit 131 of the exhaust duct 13 is opened toward the gap 34.

A gas supply passage 35 for supplying a reaction gas into the processing space 30 is formed at the center of the recess 32 of the ceiling plate member 3. The gas supply passage 35 vertically penetrates the ceiling plate member 3, in which a lower end of the gas supply passage 35 is opened downward toward the mounting table 2 side. Furthermore, the gas supply passage 35 is connected to the gas supply system 5 via a connecting member 36 and a valve mechanism 37. The connecting member 36 is made of, e.g., stainless steel or hastelloy, and has a gas flow passage formed therein. In the example of FIG. 1, the gas supply passage 35 branches into two flow passages 351 and 352, and is connected to the valve mechanism 37. The valve mechanism 37 includes, for example, four valves V1 to V4.

The exhaust mechanism 4 exhausts the interior of the process vessel 1. The exhaust mechanism 4 has an exhaust pipe 41 connected to the exhaust port 132 of the exhaust duct 13, an exhaust device 42 connected to the exhaust pipe 41, and a pressure regulation valve 43 installed in the middle of the exhaust pipe. During processing, the gas in the process vessel 1 reaches the exhaust duct 13 via the slit 131 and is exhausted from the exhaust duct 13 via the exhaust pipe 41 by the exhaust device 42 of the exhaust mechanism 4.

Figure 2:
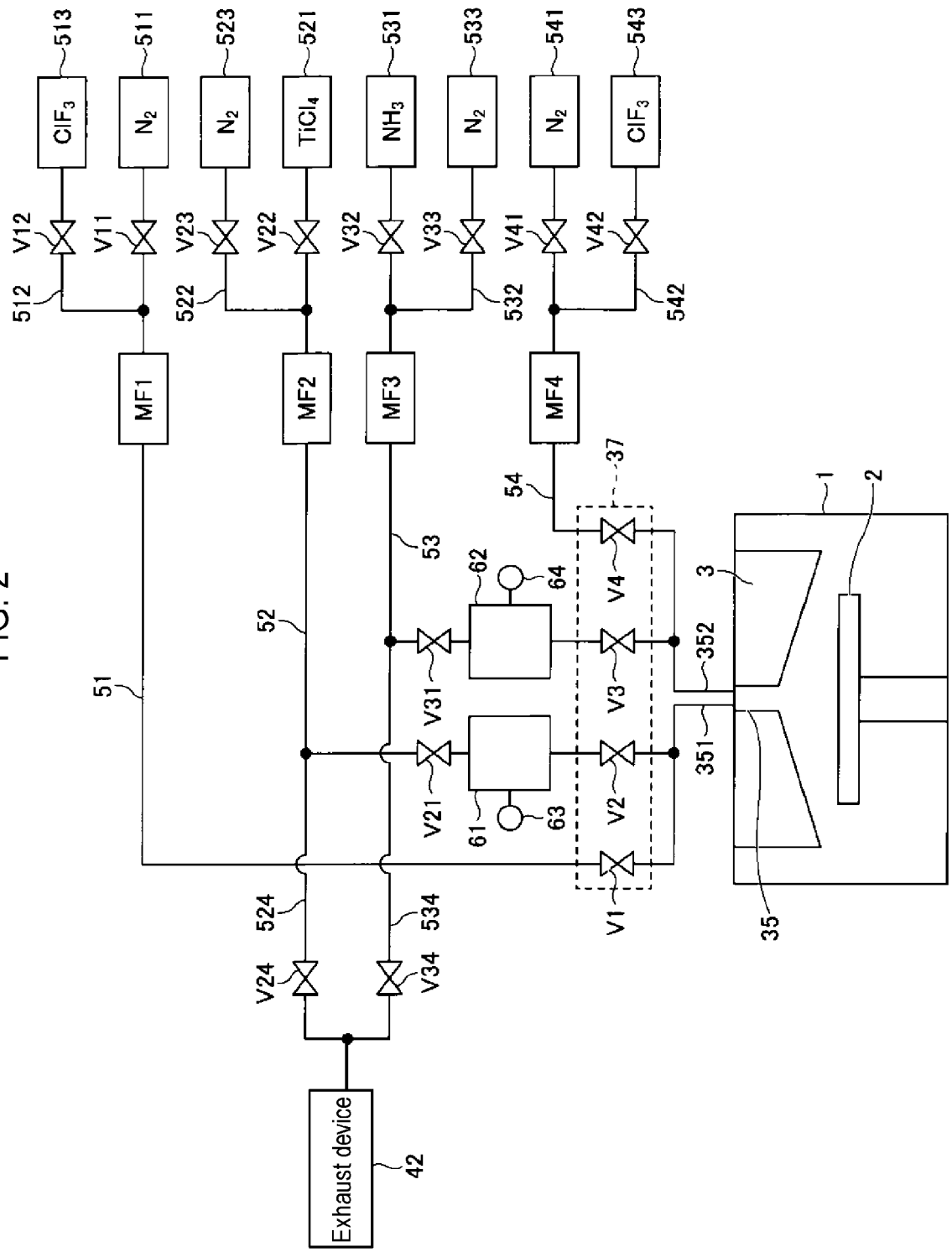
FIG. 2 is a view illustrating a gas supply system of the film forming apparatus in FIG. 1.

The gas supply system 5 will be described with reference to FIG. 2. FIG. 2 is a view illustrating the gas supply system 5 of the film forming apparatus in FIG. 1. As illustrated in FIG. 2, the gas supply system 5 has a counter gas supply passage 51, a titanium chloride supply passage 52, an ammonia supply passage 53, and a counter gas supply passage 54.

The counter gas supply passage 51 is installed separately from the titanium chloride supply passage 52 and the ammonia supply passage 53 and is connected to a supply source 511 of a nitrogen ($N_2$) gas as a counter gas. A valve V11, a flow rate adjustment part MF1, and a valve V1 are installed in the counter gas supply passage 51 sequentially from the supply source 511 side. Furthermore, the counter gas supply passage 51 branches from a portion between the flow rate adjustment part MF1 and the valve V11, and is connected to a supply source 513 of a chlorine fluoride ($ClF_3$) gas as a cleaning fluid by a branch passage 512 having a valve V12. The valves supply a gas and disconnects the supply of a gas, and the flow rate adjustment part adjusts a flow rate of the gas. The same applies to subsequent valves and flow rate adjustment parts.

The titanium chloride supply passage 52, which is a reaction gas supply passage, is connected to a supply source 521 of a titanium chloride ($TiCl_4$) gas as a reaction gas. A valve V22, a flow rate adjustment part MF2, a valve V21, a storage tank 61, and a valve V2 are installed in the titanium chloride supply passage 52 sequentially from the supply source 521 side. Furthermore, the titanium chloride supply passage 52 branches from a portion between the flow rate adjustment part MF2 and the valve V22, and is connected to a supply source 523 of a nitrogen ($N_2$) gas as a purge gas via a branch passage 522 having a valve V23. The supply source 523, the branch passage 522, and the valve V23 are an example of a purge gas supply part. In addition, an exhaust passage 524 is connected between the valve V21 and the flow rate adjustment part MF2, and is also connected to the exhaust device 42 via a valve V24. The storage tank 61, which is an example of a storage part, temporarily stores the gas flowing through the titanium chloride supply passage 52, and supplies a necessary gas in a short time. When the valve V2 between the storage tank 61 and the process vessel 1 is closed and the gas is supplied to the storage tank 61, it is configured so that the gas is stored in the storage tank 61. Furthermore, it is configured so that the inside of the storage tank 61 is raised in pressure by continuously supplying the gas to the storage tank 61. A manometer 63 for detecting an internal pressure of the storage tank is installed in the storage tank 61.

The ammonia supply passage 53, which is a reaction gas supply passage, is connected to a supply source 531 of an ammonia ($NH_3$) gas as a reaction gas. A valve V32, a flow rate adjustment part MF3, a valve V31, a storage tank 62, and a valve V3 are installed in the ammonia supply passage 53 sequentially from the supply source 531 side. Furthermore, the ammonia supply passage 53 branches from a portion between the flow rate adjustment part MF3 and the valve V32, and is connected to a supply source 533 of a nitrogen ($N_2$) gas as a purge gas via a branch passage 532 having a valve V33. The supply source 533, the branch passage 532 and the valve V33 are an example of a purge gas supply part. In addition, an exhaust passage 534 is connected between the valve V31 and the flow rate adjustment part MF3, and is also connected to the exhaust device 42 via a valve V34. The storage tank 62, which is an example of a storage part, temporarily stores the gas flowing through the ammonia supply passage 53 and supplies a necessary gas in a short time. When the valve V3 between the storage tank 62 and the process vessel 1 is closed and the gas is supplied to the storage tank 62, it is configured so that the gas is stored in the storage tank 62. Furthermore, it is configured so that the pressure inside of the storage tank 62 is raised by continuously supplying the gas to the storage tank 62. A manometer 64 for detecting an internal pressure of the tank is installed in the storage tank 62.

The counter gas supply passage 54 is installed separately from the titanium chloride supply passage 52 and the ammonia supply passage 53 and is connected to a supply source 541 of a nitrogen ($N_2$) gas as a counter gas. A valve V41, a flow rate adjuster MF4, and a valve V4 are installed in the counter gas supply passage 54 sequentially from the supply source 541 side. Furthermore, the counter gas supply passage 54 branches from a portion between the flow rate adjustment part MF4 and the valve V41, and is connected to a cleaning gas supply source 543 which is a supply source of a chlorine fluoride ($ClF_3$) gas as a cleaning fluid by a branch passage 542 having a valve V42.

The controller 6 controls operations of the respective parts of the film forming apparatus. The controller 6 has a central processing unit (CPU), a read only memory (ROM), and a random access memory (RAM). The CPU executes a desired process according to a recipe stored in a storage area such as a RAM. In the recipe, control information about process conditions of the apparatus is set. The control information may be, for example, a gas flow rate, a pressure, a temperature, or a process time. Furthermore, the recipe, and a program used by the controller 6 may be stored in, for example, a hard disk or a semiconductor memory. The recipe or the like, which is stored in a portable computer-readable storage medium such as a CD-ROM or a DVD, may also be set at a predetermined position and read out.

Film Forming Method

First Embodiment

Figure 3:
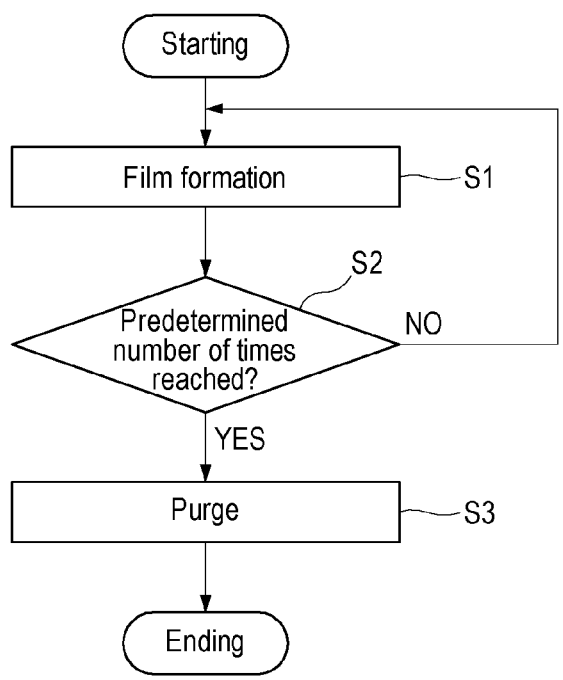
FIG. 3 is a flowchart illustrating a film forming method according to a first embodiment of the present disclosure.
Figure 4:
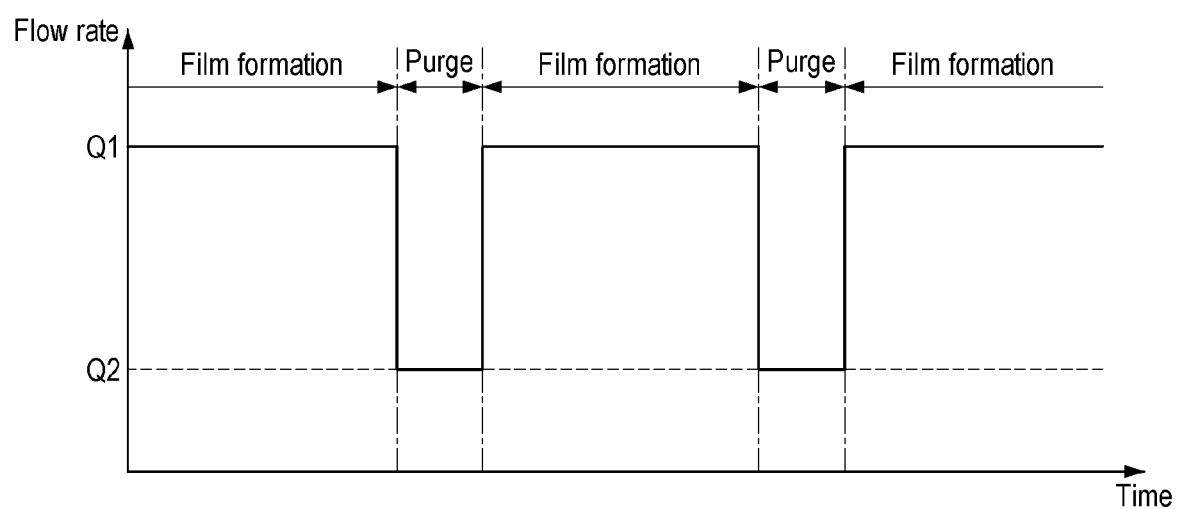
FIG. 4 is a diagram illustrating a supply sequence of a counter gas in the film forming method of FIG. 3.

A film forming method according to a first embodiment of the present disclosure will be described. The film forming method as described below is executed by controlling the operations of the respective parts of the film forming apparatus by the controller 6. FIG. 3 is a flowchart illustrating the film forming method according to the first embodiment. FIG. 4 is a diagram illustrating a supply sequence of a counter gas in the film forming method of FIG. 3.

As illustrated in FIG. 3, the film forming method according to one embodiment of the present disclosure includes a film forming step S1, a determination step S2, and a purge step S3. The film forming step S1, the determination step S2, and the purge step S3 are repeatedly performed, for example, until the number of processed wafers W reaches a predetermined number (e.g., 1,000). Each of the steps will be described below.

Film Forming Step S1

The film forming step S1 is a step of sequentially performing operations of storing a reaction gas in the storage tank installed in the reaction gas supply passage and raising the pressure in it, and then discharging the reaction gas from the storage tank into the process vessel 1, for each of a plurality of kinds of reaction gases, while continuously supplying a counter gas into the process vessel 1.

First, the interior of the process vessel 1 is depressurized to a vacuum atmosphere, and thereafter, a wafer W is loaded into the process vessel 1 by the transfer mechanism (not shown). Subsequently, the mounting table 2 heated to a predetermined temperature is moved to the transfer position, and the wafer W is transferred by cooperative work between the transfer mechanism and the support pins 25.

Subsequently, the mounting table 2 is raised to the processing position, and the internal pressure of the process vessel 1 is adjusted, and then, a titanium chloride gas is supplied via the titanium chloride supply passage 52. In the supply of the titanium chloride gas, the valve V2 is closed and the valves V21 and V22 are opened. Thus, the storage tank 61 is filled with the titanium chloride gas by supplying the titanium chloride gas to the storage tank 61 at a predetermined flow rate, e.g., 50 sccm, via the titanium chloride supply passage 52. Furthermore, the valves V1, V11, V4, and V41 are opened to introduce a nitrogen gas into the process vessel 1 at a first flow rate Q1, e.g., 3,000 sccm, via the counter gas supply passages 51 and 54. At this time, the other valves remain closed.

The pressure of the storage tank 61 is gradually raised by the titanium chloride gas supply. Then, when the internal pressure of the storage tank 61 is raised to a first pressure, e.g., 12.80 kPa (96 Torr) or higher, the valve V2 is opened to supply a predetermined amount of titanium chloride gas into the process vessel 1. The first pressure is, for example, a pressure higher than the pressure of the storage tank 61 when the supply of the titanium chloride gas to the empty storage tank 61 starts, and is set to, e.g., 12.40 kPa (93 Torr) to 13.07 kPa (98 Torr). At this step, except that the valve V2 is opened, the opening/closing state of the valves is similar to the case where the storage tank 61 is filled with the titanium chloride gas.

The titanium chloride gas and the nitrogen gas are supplied into the processing space 30 via the connecting member 36 an the flow passages 351 and 352 and the gas supply passage 35 in the ceiling plate member 3, and are guided to an inclined surface of a ceiling part of the processing space 30 and spread from the center to the outer periphery of the ceiling plate member 3 to reach the wafer W. The titanium chloride gas and the nitrogen gas that have reached the gap 34 between the leading end 33 and the cover member 22 flow out from the gap 34 into the process vessel 1 and are then discharged to the outside via the exhaust duct 13.

When the valve V2 is opened to supply the titanium chloride gas to the process vessel 1, the internal pressure of the storage tank 61 is lowered. If the pressure is, e.g., 12.40 kPa (93 Torr) or lower, the valve V2 is closed to stop the supply of the titanium chloride gas. On the other hand, the valves V1 and V4 are kept opened, and the nitrogen gas is continuously supplied from the respective counter gas supply passages 51 and 54 into the process vessel 1 at the first flow rate Q1, e.g., 3,000 sccm. The nitrogen gas is supplied into the processing space 30 via the gas flow passages 351 and 352 and the gas supply passage 35, flows out into the process vessel 1, and is exhausted from the exhaust duct 13. Thus, the titanium chloride gas both in the titanium chloride supply passage 52 and the processing space 30 is substituted by the nitrogen gas.

After the gas is substituted by the supply of nitrogen gas, an ammonia gas is supplied to the process vessel 1 via the ammonia supply passage 53. In the supply of the ammonia gas, the valve V3 is closed and the valves V31 and V32 are opened. Thus, the ammonia gas is supplied to the storage tank 62 via the ammonia supply passage 53 at a predetermined flow rate, e.g., 2,700 sccm, to be filled in the storage tank 62. In addition, the valves V1 and V4 are kept opened to continuously supply the nitrogen gas from the respective counter gas supply passages 51 and 54 into the process vessel 1 at the first flow rate Q1, e.g., 3,000 sccm. At this time, the other valves remain closed.

The pressure is gradually raised in the storage tank 62 by supplying ammonia gas. Then, when the internal pressure of the storage tank 62 is raised to a second pressure, e.g., 21.73 kPa (163 Torr) or higher, the valve V3 is opened to supply a predetermined amount of ammonia gas into the process vessel 1. The second pressure is, for example, a pressure higher than the pressure of the storage tank 62 when the supply of the ammonia gas to the empty storage tank 62 starts, and is set to, e.g., 19.20 kPa (144 Torr) to 24.93 kPa (187 Torr). At this step, except that the valve V3 is opened, the opening/closing state of the valves is similar to the case where the storage tank 62 is filled with the ammonia gas.

The ammonia gas supplied to the process vessel 1 forms the same flow as in the case of the titanium chloride gas and is supplied into the processing space 30. When the ammonia gas flowing in the processing space 30 reaches the surface of the wafer W, titanium nitride is formed by nitriding the component of the titanium chloride gas previously adsorbed to the wafer W.

When the valve V3 is opened to supply the ammonia gas to the process vessel 1, the internal pressure of the storage tank 62 is lowered. If the pressure is, e.g., 19.33 kPa (145 Torr) or lower, the valve V3 is closed to stop the supply of the ammonia gas. On the other hand, the valves V1 and V4 are kept opened to continuously supply the nitrogen gas from the respective counter gas supply passages 51 and 54 into the process vessel 1 at the first flow rate Q1, e.g., 3,000 sccm. Thus, the ammonia gas both in the ammonia supply passage 53 and the processing space 30 is substituted by the nitrogen gas.

By supplying the reaction gas (the titanium chloride gas or the ammonia gas) and the substituting gas (nitrogen gas) in the following order, the titanium chloride gas, the nitrogen gas, the ammonia gas, and the nitrogen gas, a molecular layer of titanium nitride is laminated on the surface of the wafer W to form a thin film of titanium nitride. Then, by performing the supply of the titanium chloride gas and the supply of the ammonia gas a predetermined number of times, a thin film of titanium nitride having a desired thickness is formed. In one embodiment, the supply times of the titanium chloride gas, the nitrogen gas, the ammonia gas, and the nitrogen gas are 0.05 seconds, 0.2 seconds, 0.3 seconds, and 0.3 seconds, respectively.

In this manner, after the substituting nitrogen gas is supplied and the final ammonia gas is discharged, the mounting table 2 is lowered to the transfer position. Then, after the film formation, the wafer W is unloaded in reverse order of loading, it waits for the loading of a subsequent wafer W.

Further, at the film forming step S1, the gas may be switched and supplied to the process vessel 1 in the following order, the titanium chloride gas, the nitrogen gas, the ammonia gas, and the nitrogen gas, and for example, filling of the titanium chloride gas and the ammonia gas into the storage tanks 61 and 62 is performed in parallel. In addition, for example, the supply of one of the titanium chloride gas and the ammonia gas to the process vessel 1 and the filling of the other of the titanium chloride gas and the ammonia gas into the storage tanks 61 or 62 are performed in parallel.

Determination Step S2

The determination step S2 is a step of determining whether the film forming step S1 has been performed a predetermined number of times. If it is determined at the determination step S2 that the film forming step S1 has been performed the predetermined number of times, the film forming step S1 is completed and the purge step S3 is performed. On the other hand, if it is determined at the determination step S2 that the film forming step S1 has not been performed the predetermined number of times yet, the film forming step S1 is again performed. The predetermined number of times is determined based on a thickness of a film to be formed at the film forming step S1, and may be, for example, 25 times.

Purge Step S3

The purge step S3 is a step of repeating operations of storing a purge gas in the storage tank installed in the reaction gas supply passage, raising the pressure to a pressure higher than the pressure at the time when raising the pressure of the corresponding storage tank at the film forming step S11, and discharging it from the storage tank into the process vessel 1 multiple times.

First, an actual gas removal from the ammonia supply passage 53 is performed. This step is performed through exhaust by the exhaust device 42 while opening the valves V1, V11, V4, V41, V31, and V34, closing the other valves. Thus, the ammonia supply passage 53 is exhausted at the upstream side of the valve V3, and the gas remaining within the ammonia supply passage 53 is removed.

Subsequently, an actual gas removal from the titanium chloride supply passage 52 is performed. This step is performed through exhaust by the exhaust device 42 while opening the valves V1, V11, V4, V41, V21, and V24, and closing the other valves. Thus, the titanium chloride supply passage 52 is exhausted at the upstream side of the valve V2, and the gas remaining within the titanium chloride supply passage 52 is removed.

Subsequently, the storage tanks 61 and 62 are filled with a nitrogen gas as a purge gas. That is, the valves V1, V11, V4, V41, V21, V23, V31 and V33 are opened, and the other valves are closed. Since the valves V2 and V3 are closed, the nitrogen gas flowing through each of the titanium chloride supply passage 52 and the ammonia supply passage 53 is stored in each of the storage tanks 61 and 62. In this manner, the nitrogen gas is supplied to the storage tank 61 at a predetermined flow rate, e.g., 190 sccm, via the titanium chloride supply passage 52, and the storage tank 61 is filled with the nitrogen gas. In addition, the nitrogen gas is supplied to the storage tank 62 at a predetermined flow rate, e.g., 900 sccm, via the ammonia supply passage 53, and the storage tank 62 is filled with the nitrogen gas. Furthermore, the nitrogen gas is introduced into the process vessel 1 at a second flow rate Q2 (e.g., 500 to 2,000 sccm) smaller than the first flow rate Q1 via the counter gas supply passages 51 and 54.

In the storage tanks 61 and 62, the internal pressures of the respective storage tanks 61 and 62 are gradually raised by the supply of the nitrogen gas. When the internal pressure of the storage tank 61 reaches a third pressure, e.g., 56.00 kPa (420 Torr), which is higher than the first pressure, the valve V2 is opened. Thus, the nitrogen gas is supplied from the storage tank 61 to the process vessel 1 via the titanium chloride supply passage 52 for purging. The valves opened in this state are the valves V1, V11, V4, V41, V2, V21, V23, V31, and V33.

When the nitrogen gas (purge gas) pressurized in the storage tank 61 is supplied into the process vessel 1, the nitrogen gas rapidly diffuses in the processing space 30 due to a pressure difference, and spreads into the process vessel 1 through the gap 34. In addition, the nitrogen gas is supplied to the process vessel 1 at a higher pressure because it is supplied to the process vessel 1 after being pressurized in the storage tank 61. Accordingly, in the flow passage of the nitrogen gas at the downstream side of the storage tank 61, a strong flow of the nitrogen gas occurs, and the particles existing in the flow passage are removed along with this flow. Furthermore, the flow rate of the counter gas supplied into the process vessel 1 at the purge step S3 is smaller than the flow rate of the counter gas supplied into the process vessel 1 at the film forming step S1. Thus, it is possible to suppress the momentum of the flow of the purge gas into the process vessel 1 from being weakened by the counter gas. However, if the flow rate of the counter gas is too small, since the purge gas may flow back to the counter gas supply passages 51 and 54, and the momentum of the flow of the purge gas into the process vessel 1 may be weakened, it is preferable that the second flow rate Q2 be 500 to 2,000 sccm.

As described above, when the purge gas is supplied from the storage tank 61 to the process vessel 1, the internal pressure of the storage tank 61 is lowered. Therefore, when the internal pressure of the storage tank 61 becomes, for example, 80% or more and 90% or less of the third pressure, for example, 46.66 kPa (350 Torr), the valve V2 is closed to stop the supply of the nitrogen gas to the process vessel 1. Thus, the nitrogen gas filling step is again performed in the titanium chloride supply passage 52, and the pressure of the storage tank 61 is gradually raised by the supply of the nitrogen gas to the storage tank 61. In this manner, when the internal pressure of the storage tank 61 reaches the third pressure, e.g., 56.00 kPa (420 Torr) again, the valve V2 is opened to supply the nitrogen gas to the process vessel 1 for purging. As described above, in the titanium chloride supply passage 52, the filling of the nitrogen gas into the storage tank 61 and the purging of the nitrogen gas into the process vessel 1 are repeated, for example, 100 times. At this time, the purging of the nitrogen gas into the process vessel 1 is performed for, for example, 0.1 second, and the filling of the nitrogen gas into the storage tank 61 is performed for, for example, 3 seconds.

Similarly, also in the ammonia supply passage 53, when the internal pressure of the storage tank 62 reaches a fourth pressure higher than the second pressure, e.g., 56.00 kPa (420 Torr) by the supply of the nitrogen gas, the valve V3 is opened. Thus, the nitrogen gas is supplied from the storage tank 62 into the process vessel 1 via the ammonia supply passage 53 for purging. The valves opened in this state are the valves V1, V11, V4, V41, V21, V23, V3, V31, and V33. Accordingly, in the flow passage of the nitrogen gas at the downstream side of the storage tank 62, a strong flow of the nitrogen gas occurs, and the particles existing in the flow passage are removed along with this flow. Furthermore, the flow rate of the counter gas supplied into the process vessel 1 at the purge step S3 is smaller than the flow rate of the counter gas supplied into the process vessel 1 at the film forming step S1. Thus, it is possible to suppress the momentum of the flow of the purge gas into the process vessel 1 from being weakened by the counter gas.

As described above, when the nitrogen gas is supplied from the storage tank 62 to the process vessel 1 and the internal pressure of the storage tank 62 becomes, for example, 80% or more and 90% or less of the fourth pressure, for example, 46.66 kPa (350 Torr), the valve V3 is closed to stop the supply of the nitrogen gas to the process vessel 1. Thus, in the ammonia supply passage 53, the nitrogen gas filling step is again performed, and the pressure of the storage tank 62 is gradually raised by the supply of the nitrogen gas to the storage tank 62. In this manner, when the internal pressure of the storage tank 62 reaches the fourth pressure, 56.00 kPa (420 Torr), the valve V3 is opened to supply the nitrogen gas to the process vessel 1, and the ammonia supply passage 53 is purged. As described above, in the ammonia supply passage 53, the filling of the nitrogen gas into the storage tank 62 and the purging of the nitrogen gas into the process vessel 1 are repeated, for example, 100 times. At this time, the purging of the nitrogen gas into the process vessel 1 is performed for, for example, 0.1 second, and the filling of the nitrogen gas into the storage tank 62 is performed for, for example, 2 seconds.

After performing the purge process via the titanium chloride supply passage 52 and the purge process via the ammonia supply passage 53 in this way, the removal of the nitrogen gas from the titanium chloride supply passage 52 and the removal of the nitrogen gas from the ammonia supply passage 53 are performed, and the purge process is completed. The removal of the nitrogen gas from the titanium chloride supply passage 52 is performed through exhaust by the exhaust device while opening the valves V1, V11, V4, V41, V21, and V24, closing the other opening/closing valves. Thus, the titanium chloride supply passage 52 is exhausted at the upstream side of the valve V2, and the nitrogen gas remaining within the titanium chloride supply passage 52 is removed. Furthermore, the removal of the nitrogen gas from the ammonia supply passage 53 is performed through exhausting the gas by the exhaust device while opening the valves V1, V11, V4, V41, V31, and V34, closing the other opening/closing valves. Thus, the ammonia supply passage 53 is exhausted at the upstream side of the valve V3, and the nitrogen gas remaining within the ammonia supply passage 53 is removed. During the series of purge processes, the nitrogen gas is introduced into the process vessel 1 at the second flow rate Q2, e.g., 1,000 sccm, which is smaller than the first flow rate Q1, via the counter gas supply passages 51 and 54.

According to the first embodiment, the purge step S3 of supplying the nitrogen gas (purge gas) pressurized in the storage tanks 61 and 62 into the process vessel 1 is provided. Thus, the nitrogen gas rapidly diffuses in the processing space 30 due to a pressure difference and spreads into the process vessel 1 through the gap 34. Furthermore, the nitrogen gas is supplied to the process vessel 1 at a strong pressure because it is supplied to the process vessel 1 after being pressurized in the storage tanks 61 and 62. Therefore, in the flow passage of the nitrogen gas at the downstream side of the storage tanks 61 and 62, a strong flow of the nitrogen gas occurs, and the particles existing in the flow passage are removed along with this flow.

In addition, the flow rate of the counter gas supplied into the process vessel 1 at the purge step S3 is smaller than the flow rate of the counter gas supplied into the process vessel 1 at the film forming step S1. Thus, the momentum of the flow of the purge gas into the process vessel 1 is suppressed from being weakened by the counter gas. As a result, since the product deposited in the gaps of the parts or the like in the process vessel 1, which remains when substituting the reaction gas by the counter gas at the film forming step S1, can be removed, the particles are hard to generate even when the number of processed wafers W is increased.

Second Embodiment

Figure 5:
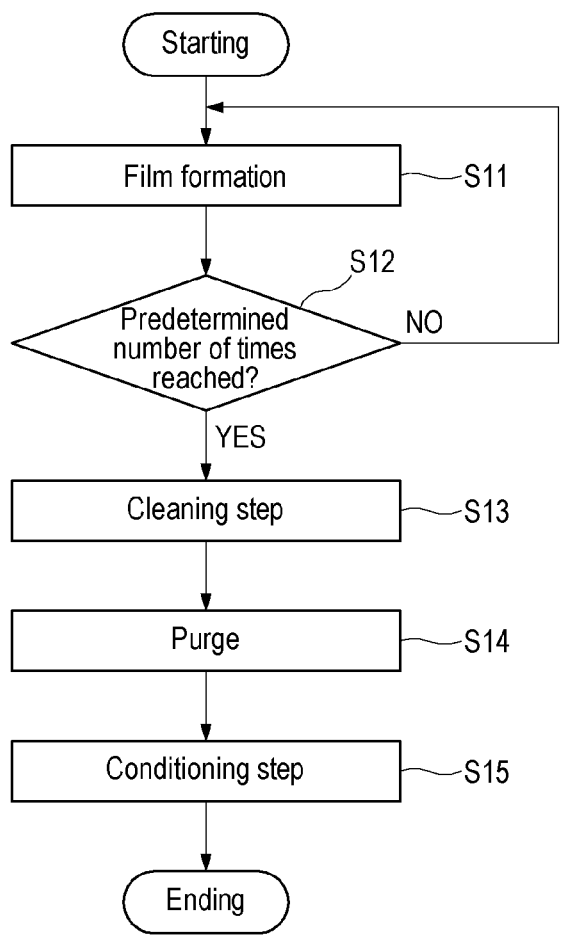
FIG. 5 is a flowchart illustrating a film forming method according to a second embodiment of the present disclosure.
Figure 6:
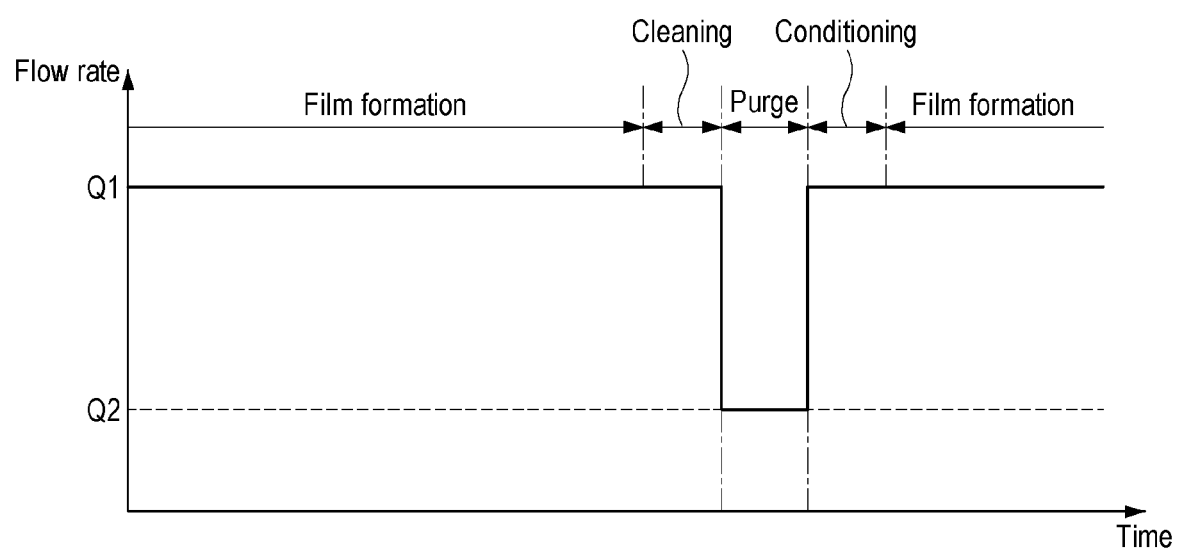
FIG. 6 is a diagram illustrating a supply sequence of a counter gas in the film forming method of FIG. 5.

A film forming method according to a second embodiment of the present disclosure will be described. The film forming method as described below is executed by controlling operations of the respective parts of the film forming apparatus by the controller 6. FIG. 5 is a flowchart illustrating the film forming method according to the second embodiment. FIG. 6 is a diagram illustrating a supply sequence of a counter gas in the film forming method of FIG. 5.

As illustrated in FIG. 5, the film forming method according to one embodiment of the present disclosure includes a film forming step S11, a determination step S12, a cleaning step S13, a purge step S14, and a conditioning step S15. Each of the steps will be described below.

Film Forming Step S11

The film forming process S11 may be similar to the film forming step S1 described in the first embodiment.

Determination Step S12

The determination step S12 is a step of determining whether the film forming step S11 has been performed a predetermined number of times. If it is determined at the determination step S12 that the film forming step S11 has been performed the predetermined number of times, the film forming step S11 is completed and the cleaning step S13 is performed. On the other hand, if it is determined at the determination step S12 that the film forming step S11 has not been performed the predetermined number of times yet, the film forming step S11 is again performed. The predetermined number of times is determined based on a thickness of a film to be formed at the film forming step S1, and may be, for example, 1,000 times.

Cleaning Step S13

The cleaning step S13 is a step of cleaning the interior of the process vessel 1 by supplying a cleaning fluid into the process vessel 1.

First, the interior of the process vessel 1 is exhausted in a vacuumed state (a state in which the pressure regulation valve 43 is fully opened). Thereafter, the valves V1 and V12 are opened to supply a predetermined flow rate of chlorine fluoride gas via the counter gas supply passage 51 for a predetermined time. At this time, the valves V4 and V41 are opened to supply a predetermined flow rate of nitrogen gas via the counter gas supply passage 54. After the predetermined time has elapsed, the valves V1, V4, V12, and V41 are closed. Subsequently, the valves V4 and V42 are opened to supply a predetermined flow rate of chlorine fluoride gas via the counter gas supply passage 54 for a predetermined time. At this time, the valves V1 and V11 are opened to supply a predetermined flow rate of nitrogen gas via the counter gas supply passage 51.

The chlorine fluoride gas is supplied into the processing space 30 via the gas flow passages 351 and 352 and the gas supply passage 35, and flows in the same path as the reaction gas. Then, it flows out into the process vessel 1 through the gap 34 and is discharged to the outside via the exhaust duct 13. Thus, since the chlorine fluoride gas is supplied to a region where the reaction gas reaches, the film deposited in the process vessel 1 is removed.

After the cleaning is performed by supplying the chlorine fluoride gas for the predetermined time, the valves V12 and V42 are closed and the valves V1, V11, V4, and V41 are opened while vacuum-exhausting the process vessel 1, and the nitrogen gas is introduced into the process vessel 1 via the counter gas supply passages 51 and 54. After this process is performed for the predetermined time, the exhaust of the process vessel 1 is stopped, and the valves V1, V11, V4, and V41 are closed and the cleaning is completed.

Purge Step S14

The purge step S14 may be similar to the purge step S3 described in the first embodiment.

Conditioning Step S15

The conditioning step S15 is a step of performing adjustment (conditioning) for performing the film forming step S11, for example, a step of forming a precoat film in the process vessel 1 by supplying the same gas as the reaction gas used at the film forming step S11 into the process vessel 1.

At the conditioning step S15, for example, in a state in which the wafer W is not mounted on the mounting table 2 in the process vessel 1, film formation is performed by the same method as the film forming step S11.

As described above, according to the second embodiment, the purge step S14 of supplying the nitrogen gas (purge gas) pressurized in the storage tanks 61 and 62 into the process vessel 1 is provided. Thus, the nitrogen gas rapidly diffuses in the processing space 30 due to a pressure difference, and spreads into the process vessel 1 through the gap 34. Furthermore, the nitrogen gas is supplied to the process vessel 1 at a strong pressure because it is supplied to the process vessel 1 after being pressurized in the storage tanks 61 and 62. Accordingly, in the flow passage of the nitrogen gas at the downstream side of the storage tanks 61 and 62, a strong flow of the nitrogen gas occurs, and the particles existing in the flow passage are removed along with this flow.

In addition, the flow rate of the counter gas supplied into the process vessel 1 at the purge step S14 is smaller than the flow rate of the counter gas supplied into the process vessel 1 at the film forming step S11. Thus, the momentum of the flow of the purge gas into the process vessel 1 is suppressed from being weakened by the counter gas. Therefore, it is possible to remove the product deposited in the gaps of the parts or the like in the process vessel 1 which is difficult to remove at the cleaning step S13. As a result, since the adhesion of the precoat film formed on the inner surface of the process vessel 1 at the conditioning step S15 is improved, it is possible to suppress generation of particles resulting from delamination of the precoat film.

In addition, after the cleaning step S13 is performed, in the flow passage of the cleaning gas such as the inner wall of the process vessel 1, the cleaning residue may remain as particles without being exhausted. Thus, when the purge step S14 is performed after the cleaning step S13, even if the cleaning residue is adhered to the inner wall or the like of the process vessel 1, a strong impact is given by the purge gas so that the deposit is delaminated from the inner wall and is discharged outside the process vessel 1 with the strong flow of the purge gas.

After the purge step S14 is performed, the film forming step S11 is performed by supplying a reaction gas to the process vessel 1. At this time, however, the reaction gas supplied to the process vessel 1 has a supply pressure smaller than that of the purge gas. Therefore, even if the residue remains adhered to the flow passage of the reaction gas such as the inner wall of the process vessel 1 after the cleaning step S13, since the residue is a residue that has not been moved or removed with the purge gas having the large supply pressure at the purge step S14, it is difficult to consider that the residue moves along with the flow of the reaction gas during the supply of the reaction gas to become particles and to be adhered to the wafer W. By performing the purge step S14 after the cleaning step S13 in this way, it is possible to further reduce particle contamination of the wafer W.

EXAMPLES

Example 1

In example 1, the film forming step S1, the determination step S2, and the purge step S3 described above were repeatedly performed using the film forming apparatus illustrated in FIG. 1. That is, in example 1, a processing condition in which the flow rate of the counter gas supplied into the process vessel 1 at the purge step S3 is smaller than the flow rate of the counter gas supplied into the process vessel 1 at the film forming step S1 was used. Furthermore, the predetermined number of times at the determination step S2 was 25 times.

Then, the number of particles adhered to a wafer W was measured each time several tens to several hundreds of wafers W were processed. In addition, particles having a particle diameter of 80 nm or more were measured.

Comparative Example 1

In comparative example 1, the flow rate of the counter gas supplied into the process vessel 1 at the purge step S3 was similar to the flow rate of the counter gas supplied into the process vessel 1 at the film forming step S1. In addition, the processing conditions similar to example 1 were used for other points.

Then, the number of particles adhered to a wafer W was measured each time several tens to several hundreds of wafers W were processed. In addition, particles having a particle diameter of 80 nm or more were measured.

Comparative Example 2

In comparative example 2, the film forming step S1 was continuously performed without performing the determination step S2 and the purge step S3. In addition, the processing conditions similar to example 1 were used for other points.

Then, the number of particles adhered to a wafer W was measured each time several tens to several hundreds of wafers W were processed. In addition, particles having a particle diameter of 80 nm or more were to be measured.

Evaluation Results

Figure 7:
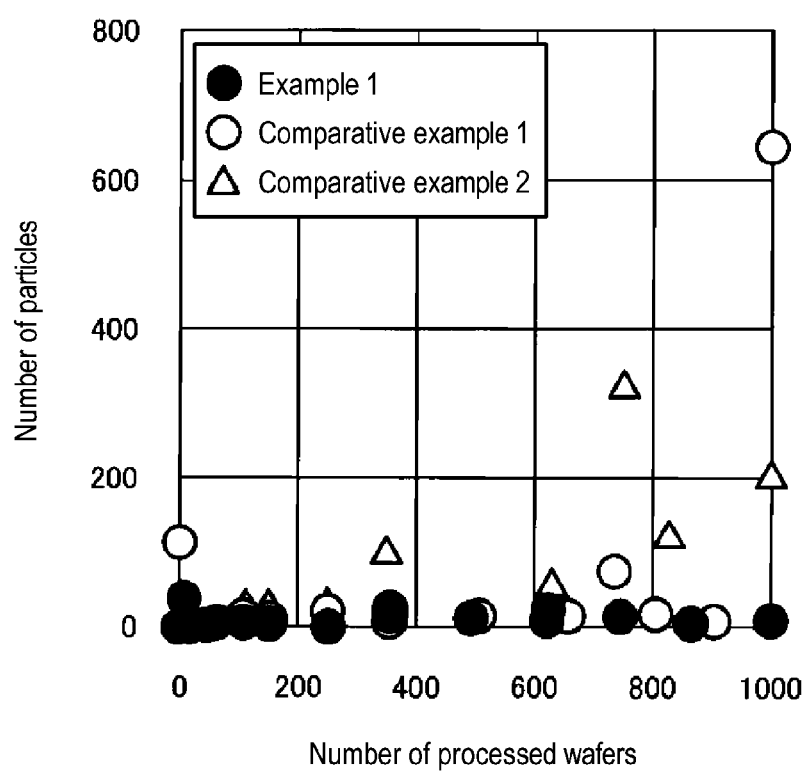
FIG. 7 is a diagram illustrating a relationship between the number of processed wafers and the number of particles.

FIG. 7 is a diagram illustrating a relationship between the number of processed wafers and the number of particles. In FIG. 7, the horizontal axis indicates a number of processed wafers in the film forming step, and the vertical axis indicates a number of particles. In FIG. 7, a result of example 1 is indicated by "●", a result of comparative example 1 is indicated by "○", and a result of comparative example 2 is indicated by "Δ".

As illustrated in FIG. 7, in example 1, even if the number of processed wafers W reaches 1,000, almost no particles are adhered to the wafers W. On the other hand, in comparative examples 1 and 2, before the number of processed wafers W reached 1,000, wafers W to which a large number of particles were adhered were identified.

From the above results, it can be said that, by setting the flow rate of the counter gas supplied into the process vessel 1 at the purge step S3 to be smaller than the flow rate of the counter gas supplied into the process vessel 1 at the film forming step S1, the particles adhered to the wafer W can be reduced. It is estimated that this suppresses the momentum of the flow of the purge gas into the process vessel 1 from being weakened by the counter gas when the high pressure purge gas raised in pressure in the storage tanks 61 and 62 is supplied into the process vessel 1 and hence suppresses the reduction of the purge efficiency.

Although the nitrogen gas was exemplified as the counter gas and the purge gas in the aforementioned embodiments, the present disclosure is not limited thereto. The counter gas and the purge gas may be, for example, an inert gas such as an argon gas. The counter gas and the purge gas may also be the same kind of gases or different kinds of gases.

According to the present disclosure in some embodiments, it is possible to reduce particles adhered to a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a thin film by repeating a cycle of separately supplying a plurality of kinds of reaction gases that react with each other to a substrate in a process vessel, which is in a vacuum atmosphere, via a reaction gas supply passage provided for each of the plurality of kinds of the reaction gases continuously and laminating a reaction product thereon, while continuously supplying a counter gas from a counter gas supply passage provided separately from the reaction gas supply passage provided for each kind of the reaction gases, the method comprising:

forming a film on the substrate loaded in the process vessel until a predetermined thickness of the film is formed on the substrate by repeating another cycle of separately performing operations for each of the plurality of kinds of reaction gases, the operations including storing the reaction gas in a storage part provided in the reaction gas supply passage to raise a pressure in the storage part to a first pressure and then discharging the reaction gas from the storage part into the process vessel, while continuously supplying the counter gas; and responsive to the predetermined thickness of the film being formed on the substrate, purging, by repeating multiple times operations of storing a purge gas in the storage part provided in the reaction gas supply passage to raise the pressure in the storage part to a second pressure higher than the first pressure, and discharging the purge gas from the storage part into the process vessel via a flow path at a downstream side of the storage part leading to the process vessel, wherein a flow rate of the counter gas supplied into the process vessel via the flow path in the purging is smaller than a flow rate of the counter gas supplied into the process vessel in the forming the film.

2. The method of claim 1, wherein the purging is performed each time the forming the film is performed a predetermined number of times.

3. The method of claim 1, further comprising:

cleaning an interior of the process vessel by supplying a cleaning fluid into the process vessel; and conditioning by forming a precoat film in the process vessel by supplying the same kind gases as the reaction gases used in the forming the film into the process vessel and, wherein the purging is performed after the cleaning and before the conditioning.

4. The method of claim 1, wherein after the purge gas is discharged from the storage part increased in pressure by the purge gas into the process vessel, a pressure of the storage part when a valve at a downstream side of the storage part is closed for next pressure increase in the storage part by the purge gas is set to 80% or more and 90% or less of a second pressure.

5. The method of claim 1, wherein the counter gas is the same gas as the purge gas.

6. The method of claim 1, wherein the counter gas is an argon gas or a nitrogen gas.

* * * * *